United States Patent
Carney et al.

(10) Patent No.: US 11,257,759 B1
(45) Date of Patent: Feb. 22, 2022

(54) ISOLATION IN A SEMICONDUCTOR DEVICE

(71) Applicant: SEMICONDUCTOR COMPONENTS INDUSTRIES, LLC, Phoenix, AZ (US)

(72) Inventors: Francis J. Carney, Mesa, AZ (US); Yusheng Lin, Phoenix, AZ (US); Takashi Noma, Ota (JP)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 16/949,322

(22) Filed: Oct. 26, 2020

(51) Int. Cl.
| | | |
|---|---|---|
| H01L 21/00 | (2006.01) | |
| H01L 23/528 | (2006.01) | |
| H01L 21/48 | (2006.01) | |
| H01L 23/31 | (2006.01) | |
| H01L 23/498 | (2006.01) | |

(52) U.S. Cl.
CPC ........ H01L 23/528 (2013.01); H01L 21/4814 (2013.01); H01L 23/3114 (2013.01); H01L 23/49844 (2013.01)

(58) Field of Classification Search
CPC .............. H01L 23/528; H01L 23/3114; H01L 23/49844
See application file for complete search history.

(56) References Cited

U.S. PATENT DOCUMENTS

| | | | | |
|---|---|---|---|---|
| 8,674,800 | B2* | 3/2014 | Willkofer | H01L 25/0657 336/200 |
| 2005/0011986 | A1* | 1/2005 | Foo | B65H 18/026 242/532.6 |
| 2008/0296611 | A1* | 12/2008 | Kobayashi | H01L 29/7397 257/133 |
| 2013/0328166 | A1* | 12/2013 | Willkofer | H01L 23/49575 257/531 |
| 2019/0267344 | A1* | 8/2019 | Seddon | H01L 24/95 |
| 2020/0203290 | A1* | 6/2020 | Summerfelt | H01L 25/50 |
| 2021/0167002 | A1* | 6/2021 | Seddon | H01L 21/565 |

* cited by examiner

*Primary Examiner* — Laura M Menz
(74) *Attorney, Agent, or Firm* — Brake Hughes Bellermann LLP

(57) ABSTRACT

According to an aspect, a semiconductor device for integrating multiple transistors includes a wafer substrate including a first region and a second region, where the first region defines at least a portion of at least one first transistor and the second region defines at least a portion of at least one second transistor. The semiconductor device includes an isolation area located between the first region and the second region, at least one conductive pad of the at least one first transistor contacting the first region of the wafer substrate, at least one conductive pad of the at least one second transistor contacting the second region of the wafer substrate, a backplate coupled to the wafer substrate, and an encapsulation material, where the encapsulation material has a portion contacting the backplate, and the encapsulation material includes a portion located within the isolation area.

20 Claims, 11 Drawing Sheets

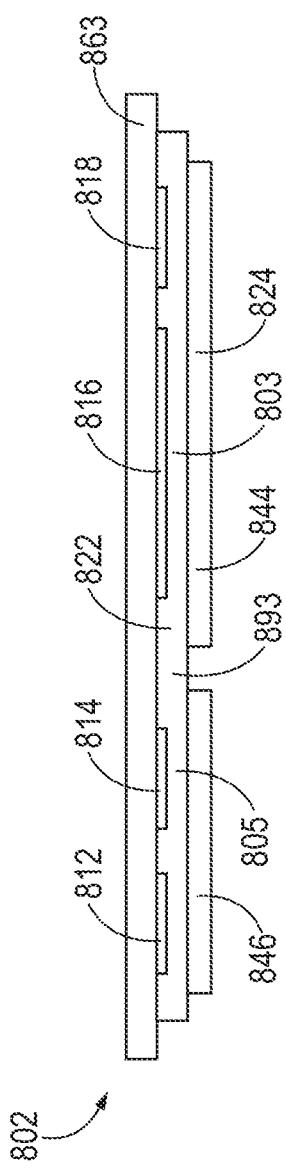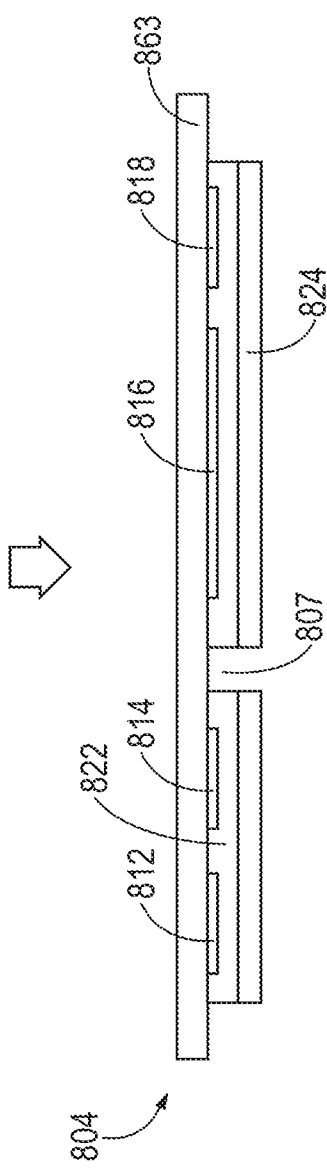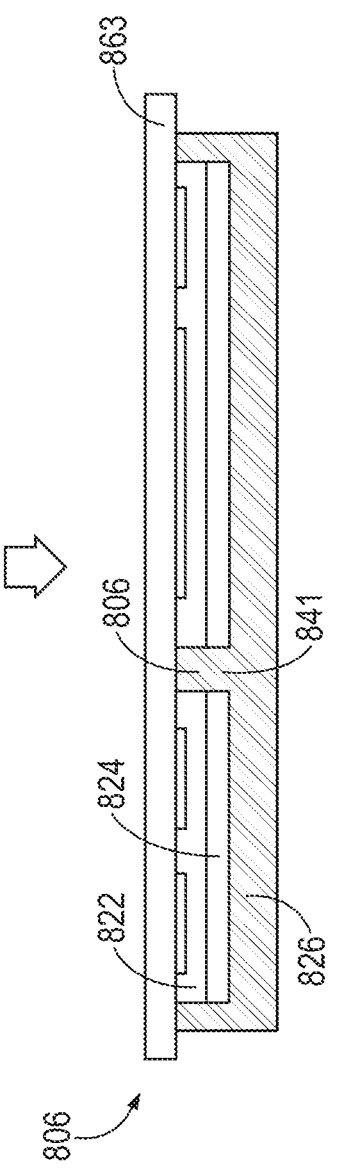

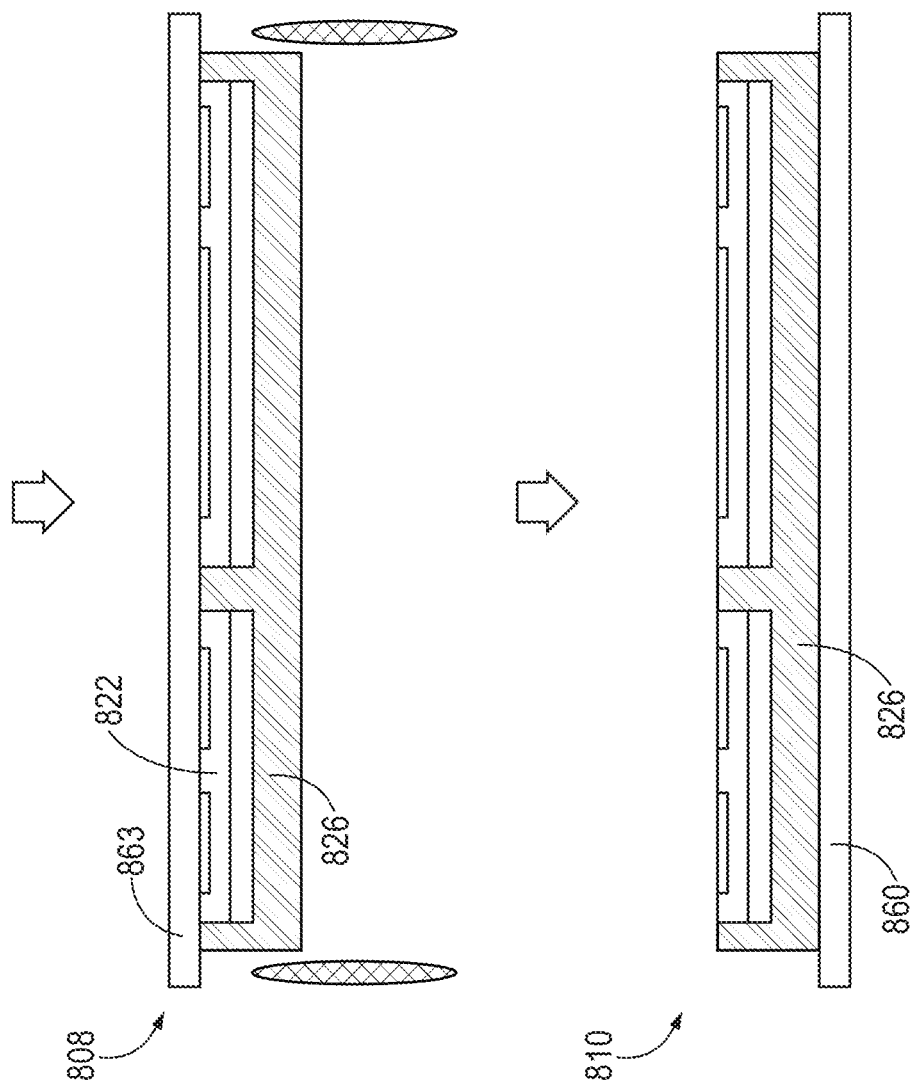

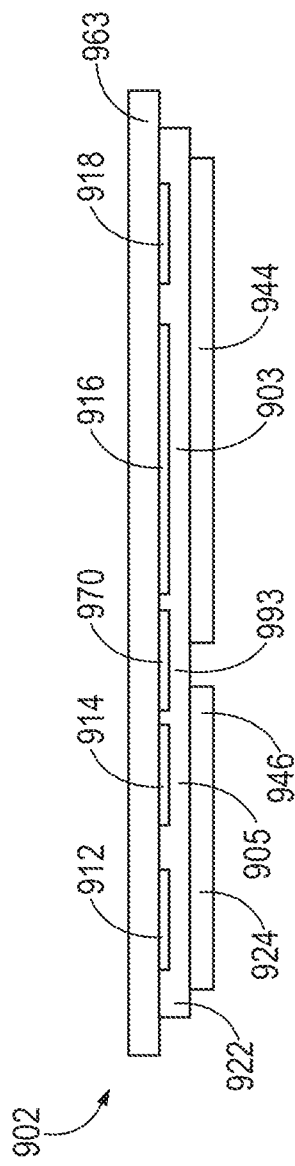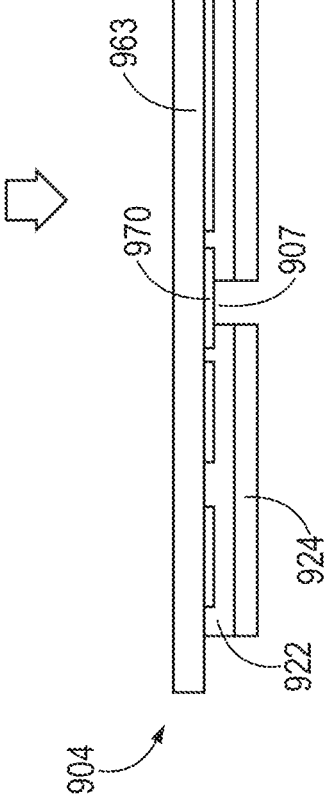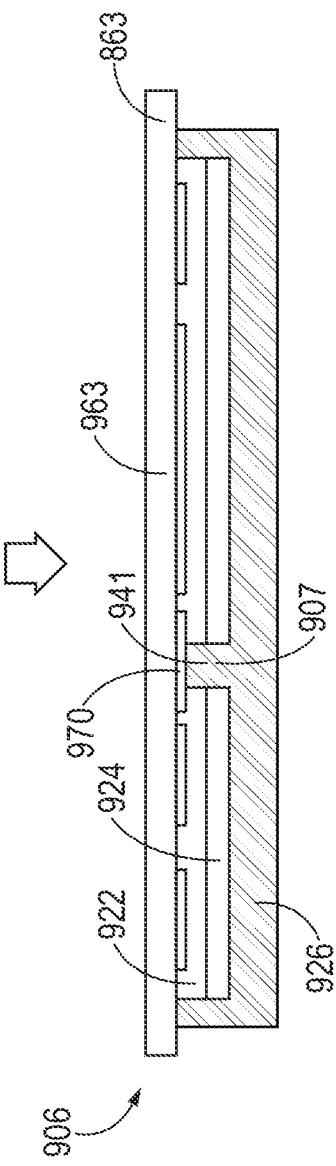

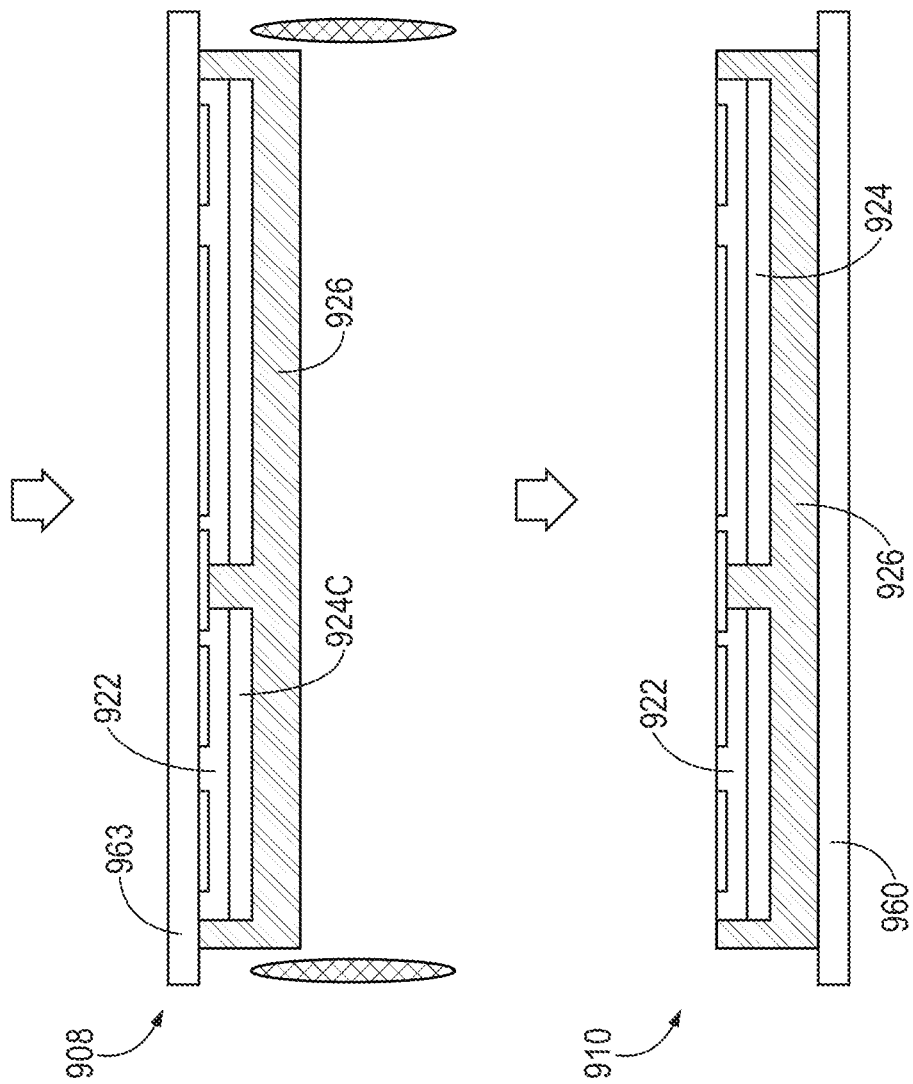

1000

```
┌─────────────────────────────────────────────────┐
│  Providing a wafer substrate assembly, the wafer │
│ substrate assembly including a carrier member, a wafer │  1002
│   substrate coupled to the carrier member, a first    │
│   backplate portion coupled to a first region of the wafer │
│  substrate, and a second backplate portion coupled to a │
│       second region of the wafer substrate       │
└─────────────────────────────────────────────────┘
                         │
                         ▼
┌─────────────────────────────────────────────────┐
│   Removing a portion of the wafer substrate located   │  1004
│  between the first backplate portion and the second  │
│     backplate portion to create an isolation area    │
└─────────────────────────────────────────────────┘
                         │
                         ▼
┌─────────────────────────────────────────────────┐
│    Applying an encapsulation material to the wafer   │  1006
│  substrate assembly, including depositing a portion of the │
│    encapsulation material within the isolation area   │
└─────────────────────────────────────────────────┘
```

FIG. 10

ISOLATION IN A SEMICONDUCTOR DEVICE

TECHNICAL FIELD

This description relates to isolation in a semiconductor device.

BACKGROUND

A semiconductor package may include multiple devices such as multiple transistors (e.g., field-effect transistors (FETs)). However, some conventional semiconductor packages may be relatively large and expensive to manufacture to ensure proper isolation between the devices.

SUMMARY

According to an aspect, a semiconductor device for integrating multiple transistors includes a wafer substrate including a first region and a second region, where the first region defines at least a portion of at least one first transistor and the second region defines at least a portion of at least one second transistor. The semiconductor device includes an isolation area located between the first region and the second region, at least one conductive pad of the at least one first transistor contacting the first region of the wafer substrate, at least one conductive pad of the at least one second transistor contacting the second region of the wafer substrate, a backplate coupled to the wafer substrate, and an encapsulation material, where the encapsulation material has a portion contacting the backplate, and the encapsulation material includes a portion located within the isolation area.

According to some aspects, the semiconductor device may include one or more of the following features (or any combination thereof). The isolation area is a first isolation area, and the wafer substrate includes a third region, where the third region defines at least a portion of at least one third transistor. The semiconductor device includes a second isolation area located between the first region and the third region, where the encapsulation material includes a portion located within the second isolation area. The semiconductor device may include a dielectric layer having a portion that contacts the portion of the encapsulation material located within the isolation area. The backplate includes a first region and a second region, where the first region of the backplate contacts the first region of the wafer substrate, and the second region of the backplate contacts the second region of the wafer substrate. The isolation area extends between the first region of the backplate and the second region of the backplate. The encapsulation material includes a portion that contacts the first region of the backplate and a portion that contacts the second region of the backplate. The first region defines a first edge and a second edge, and the second region defines a first edge and a second edge, where the portion of the encapsulation material located within the isolation area contacts the second edge of the first region and the second edge of the second region. The encapsulation material includes a portion that contacts the first edge of the first region, and a portion that contacts the first edge of the second region. The at least one first transistor is a power field-effect transistor (FET). The at least one second transistor is a sensor field effect transistor (FET).

According to an aspect, a semiconductor device for integrating multiple transistors includes a wafer substrate including a first region and a second region, where the first region defines at least a portion of at least one first transistor, and the second region defines at least a portion of at least one second transistor. The semiconductor device includes a backplate including a first region and a second region, where the first region of the backplate contacts the first region of the wafer substrate, and the second region of the backplate contacts the second region of the wafer substrate. The semiconductor device includes an isolation area located between the first region of the wafer substrate and the second region of the wafer substrate, where the isolation area extends between the first region of the backplate and the second region of the backplate. The semiconductor device includes an encapsulation material, where the encapsulation material includes a portion that contacts the first region of the backplate, and a portion that contacts the second region of the backplate, and a portion located within the isolation area.

According to some aspects, the semiconductor device may include one or more of the following features (or any combination thereof). The semiconductor device may include at least one conductive pad of the first transistor contacting the first region of the wafer substrate, and at least one conductive pad of the second transistor contacting the second region of the wafer substrate. The at least one conductive pad of the at least one first transistor includes a source terminal and a gate terminal of the at least one transistor, where the at least one conductive pad of the at least one second transistor includes a source terminal and a gate terminal of the at least one second terminal. The at least one first transistor includes two first transistors, and the at least one second transistor includes two second transistors, where drains of the two first transistors are connected in series and drains of the two second transistors are connected in series. The semiconductor device includes a dielectric material layer having a first portion, a second portion, and a third portion, where the first portion contacts the first region of the wafer substrate and the second portion contacts the portion of the encapsulation material located within the isolation area and the third portion contacts the second region of the wafer substrate. The encapsulation material includes a molding material. The first region of the wafer substrate defines a first edge and a second edge, and the second region of the wafer substrate defines a first edge and a second edge, where the portion of the encapsulation material located within the isolation area contacts the second edge of the first region and the second edge of the second region. The encapsulation material includes a portion that contacts the first edge of the first region, and a portion that contacts the first edge of the second region. The at least one first transistor is a power field-effect transistor (FET), and the at least one second transistor is a sensor FET.

According to an aspect, a method for integrating multiple transistors in a semiconductor device includes providing a wafer substrate assembly, the wafer substrate assembly including a carrier member, a wafer substrate coupled to the carrier member, a first backplate portion coupled to a first region of the wafer substrate, and a second backplate portion coupled to a second region of the wafer substrate, removing a portion of the wafer substrate located between the first backplate portion and the second backplate portion to create an isolation area, and applying an encapsulation material to the wafer substrate assembly, including depositing a portion on the first and second backplate portions and depositing a portion of the encapsulation material within the isolation area. In some examples, the wafer substrate assembly includes a dielectric material layer that contacts the wafer substrate at a location between the first region and the second region, where the portion of the encapsulation material contacts the dielectric material layer.

The details of one or more implementations are set forth in the accompanying drawings and the description below. Other features will be apparent from the description and drawings, and from the claims.

BRIEF DESCRIPTION OF THE DRAWINGS

FIGS. 8A through 8E illustrate operations for creating an isolation area between two devices according to an aspect.

FIGS. 9A through 9E illustrate operations for creating an isolation area between two devices according to an aspect.

FIG. 10 illustrates a flowchart for fabricating a semiconductor device according to an aspect.

DETAILED DESCRIPTION

Figure 1A:
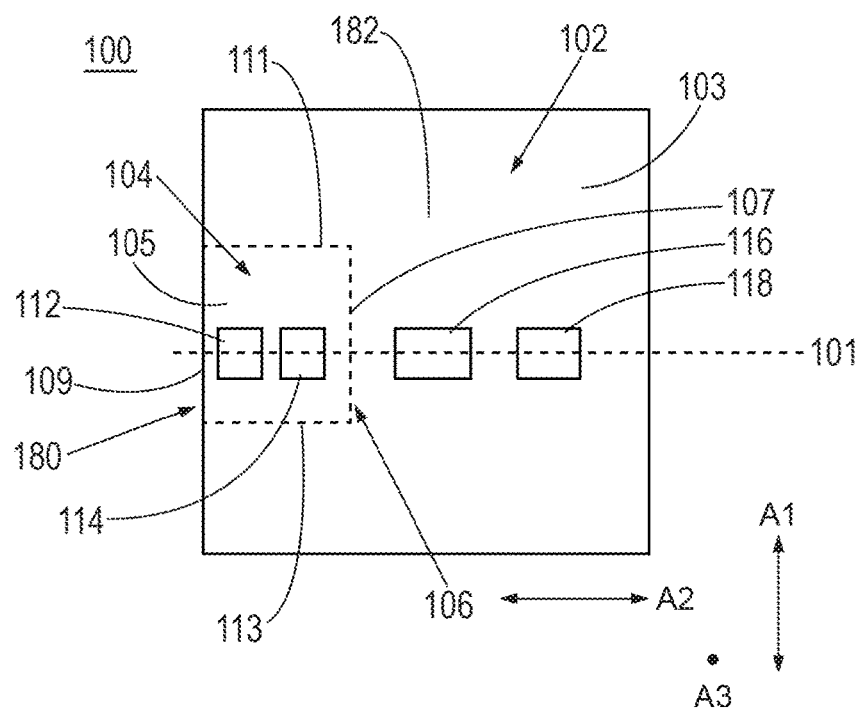
FIG. 1A illustrates a top view perspective of a semiconductor device having an isolation area to separate multiple devices according to an aspect.

The present disclosure relates to a semiconductor device that integrates multiple transistors on a single chip in a manner that isolates one or more transistors from another transistor. In some examples, the semiconductor device may include a sensor transistor (or multiple sensor transistors) and a power transistor (or multiple power transistors) on a single chip, where the sensor transistor(s) are isolated from the power transistor(s) via one or more isolation areas. In this manner, cross-conduction (or crosstalk) can be reduced or minimized between the power transistor(s) and the sensor transistor(s). In some examples, the sensor transistor(s) and/or the power transistor(s) include field effect transistor(s) (FET(s)). However, the semiconductor device may include any type of transistors besides sensor transistors and power transistors. The isolation area includes an encapsulation material. In some examples, the isolation area includes an encapsulation material and a dielectric layer. In some examples, the semiconductor device includes a 2-in-1 low-voltage (LV) metal oxide silicon field effect transistor (MOSFET) (e.g., two devices in one chip). In some examples, the semiconductor device includes a 3-in-1 LV MOSFET (e.g., three devices in one chip). In some examples, the semiconductor device includes a 4-in-1 LV MOSFET (e.g., four devices in one chip). However, the embodiments discussed herein may include any number of devices integrated into the single chip, which may include more than four devices in one chip.

The semiconductor device may include a wafer substrate (e.g., a silicon substrate) that includes a first region and a second region. The first region may define at least a portion of a first transistor (or multiple first transistors). In some examples, the first region includes a pair of transistors with their drains connected in series. The second region may define at least a portion of a second transistor (or multiple second transistors). In some examples, the second region includes a pair of second transistors with their drains connected in series. In some examples, the pair of second transistors are connected in parallel with the pair of first transistors.

Conduction pad(s) of the first transistor(s) may contact (or be coupled to) the first region of the wafer substrate (e.g., a top surface of the wafer substrate). Conduction pad(s) of the second transistor(s) may contact (or be coupled to) the second region of the wafer substrate (e.g., the top surface of the wafer substrate). The semiconductor device includes an isolation area located between the first region and the second region. In some examples, the isolation area is a portion of the wafer substrate that has been removed during the manufacturing process. The semiconductor device includes a backplate coupled to the backside of the wafer substrate. In some examples, the backplate includes separate regions, where a first region of the backplate is coupled to the first region of the wafer substrate and a second region of the backplate is coupled to the second region of the wafer substrate. In some examples, the isolation area extends into the space between an inner edge of the backplate's first region and an inner edge of the backplate's second region.

In some implementations, the semiconductor device includes an encapsulation material, where a portion of the encapsulation material is located within the isolation area. In some examples, the encapsulation material includes a molding material. The portion of the encapsulation material located within the isolation area may provide isolation between the first transistor(s) and the second transistor(s). In some examples, the encapsulation material includes a portion that contacts the backplate (e.g., the backplate's first and second regions), and portions that extends along outer edges of the backplate and outer edges of the wafer substrate. In some examples, the semiconductor device includes a dielectric layer coupled to the wafer substrate at a location between the first region of the wafer substrate and the second region of the wafer substrate. In some examples, the encapsulation material has a portion that contacts the dielectric layer within the isolation area. The dielectric layer may further assist in providing isolation between the first transistor(s) and the second transistor(s).

Figure 1B:
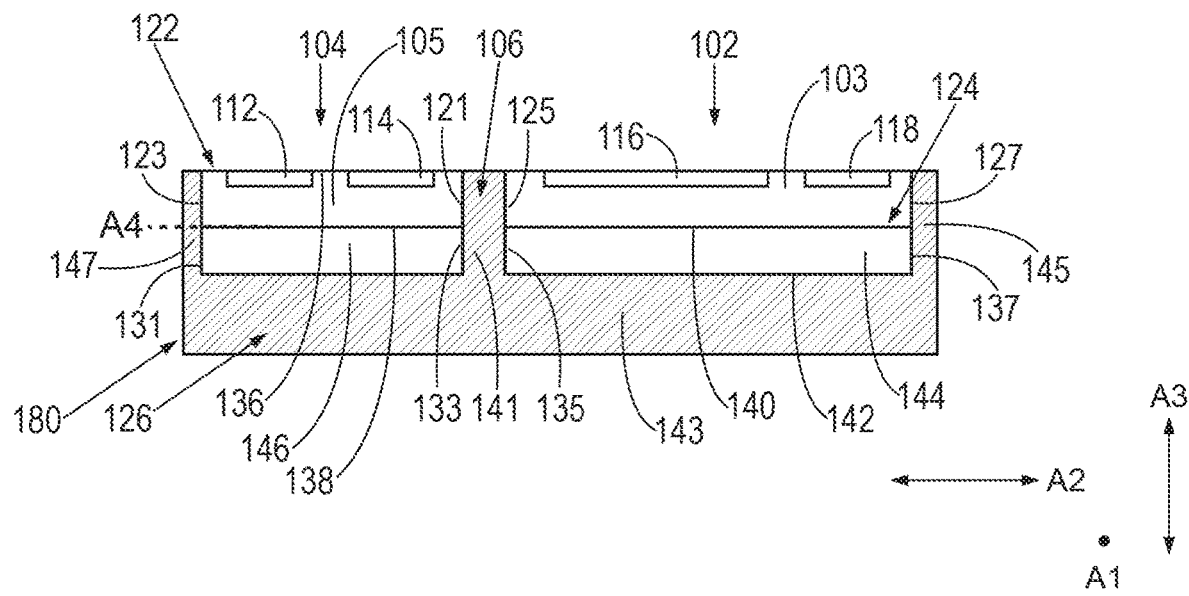
FIG. 1B illustrates a cross sectional view of the semiconductor device according to an aspect.
Figure 1C:
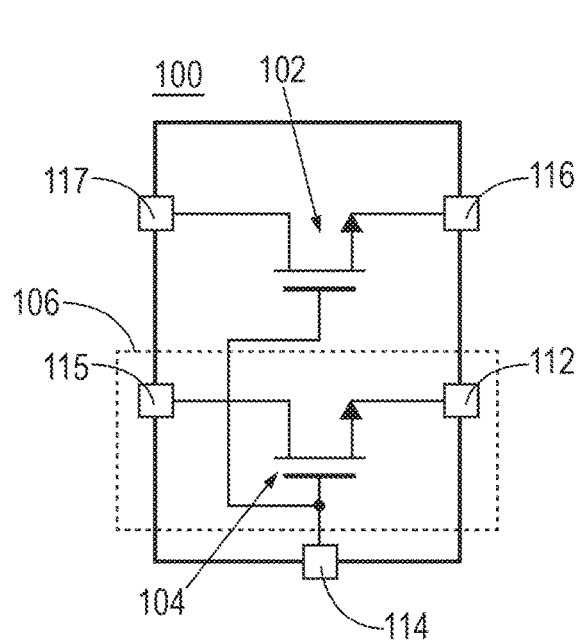
FIGS. 1C through 1E illustrate electrical diagrams of a semiconductor device according to various aspects.
Figure 1D:
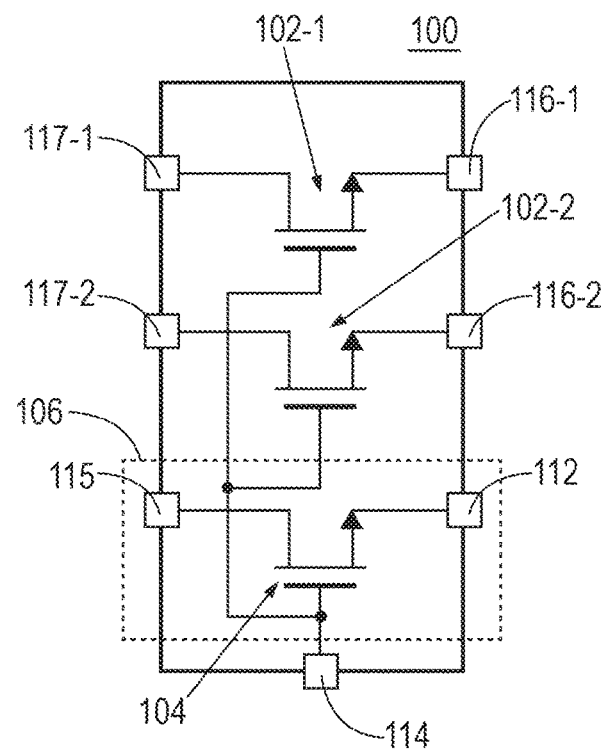
Figure 1E:
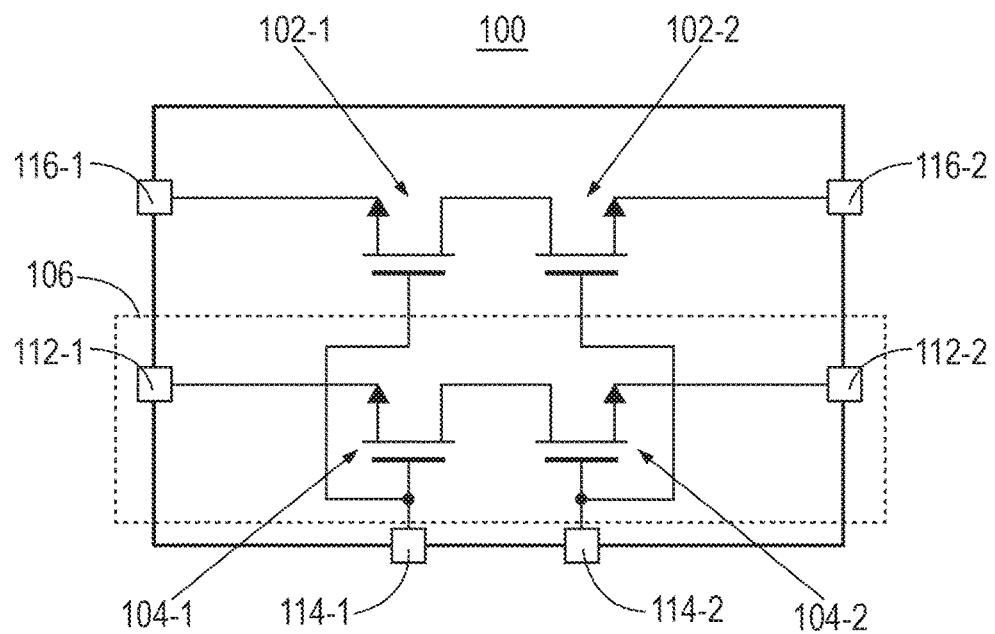

FIGS. 1A through 1E illustrate a semiconductor device 100 according to various aspects. FIG. 1A illustrates a top view perspective of the semiconductor device 100. FIG. 1B illustrates a cross-sectional view of the semiconductor device 100 of FIG. 1A taken along the line 101. FIGS. 1C through 1E illustrate electrical diagrams of the semiconductor device 100 according to various aspects. The semiconductor device 100 includes a transistor 102 and a transistor 104, where the transistor 104 is isolated from the transistor 102 via an isolation area 106. The transistor 102 may be any type of transistor such as a bipolar junction transistor (BJT) or field effect transistor (FET). The transistor 104 may be any type of transistor such as a BJT or FET. In some examples, the transistor 102 is a power transistor (or main transistor). In some examples, the transistor 102 is a power FET. In some examples, the transistor 102 represents multiple transistors. In some examples, the transistor 102 represents multiple FETs (e.g., a pair of FETs). In some examples, the drains of the pair of FETs are connected in series with each other. In some examples, the transistor 104 is a sensor FET. In some examples, the transistor 104 represents multiple transistors. In some examples, the transistor 104 represents FETs (e.g., a pair of FETs). In some examples, the drains of the pair of FETs are connected in series with each other. In some examples, the pair of FETs are disposed in parallel with the pair of power FETs. However, the embodiments encompass other types of electrical connections as shown with respect to FIGS. 1C through 1E.

In some examples, the semiconductor device 100 is a low-voltage semiconductor chip having a power FET (or multiple power FETs) and a sensor FET (or multiple sensor FETs), where the sensor FET(s) are isolated from the power FET(s) via the isolation area 106. In some examples, the semiconductor device 100 is a low-voltage semiconductor chip for battery protection. In some examples, the semiconductor device 100 includes a 2-in-1 low-voltage (LV) metal oxide silicon field effect transistor (MOSFET) (e.g., two devices in one chip).

As shown in FIG. 1B, the semiconductor device 100 includes a wafer substrate 122. The wafer substrate 122 includes a silicon material (e.g., crystalline silicon (c-Si)). The wafer substrate 122 includes a first surface 136 and a second surface 138. In some examples, the second surface 138 is disposed in parallel with the first surface 136. The second surface 138 is disposed in a plane A4. The distance between the first surface 136 and the second surface 138 may define the thickness of the wafer substrate 122 in a direction A3. The direction A3 is aligned perpendicular to the plane A4, and a direction A2 is perpendicular to the direction A3. A direction A1 is orthogonal to directions A1 and A2. As shown in FIG. 1A, the direction A3 is depicted into the page (shown as a dot). However, since FIG. 1B is a cross-sectional view, the direction A1 on FIG. 1B is depicted into the page (as shown as a dot).

The wafer substrate 122 includes a first region 103 and a second region 105. The first region 103 may define (or include) the transistor 102 (or at least a portion thereof). The second region 105 may define (or include) the transistor 104 (or at least a portion thereof). The semiconductor device 100 includes one or more conductive pads (e.g., 116, 117, and/or 118) for the transistor 102. A conductive pad may be a terminal or electrode, and may correspond to a gate, source, or drain of a respective transistor. The conductive pad includes a metal layer configured to operate as a contact (e.g., external contact) for the semiconductor device 100 (e.g., which can be connected to an external device).

The semiconductor device 100 may include a conductive pad 116 associated with the transistor 102, and a conductive pad 118 associated with the transistor 102. In some examples, the transistor 102 is associated with three conductive pads. In some examples, the conductive pad 116 is larger than the conductive pad 118. In some examples, the conductive pad 116 is a source contact. In some examples, the conductive pad 116 is a gate contact or a drain contact. In some examples, the conductive pad 118 is a gate contact. In some examples, the conductive pad 118 is a source contact or a drain contact. The conductive pad 116 contacts (or is coupled to) the first region 103 of the wafer substrate 122. In some examples, the conductive pad 116 contacts (or is embedded) with the first surface 136 of the wafer substrate 122. The conductive pad 118 contacts (or is coupled to) the first region 103 of the wafer substrate 122. In some examples, the conductive pad 118 contacts (or is embedded) with the first surface 136 of the wafer substrate 122. In some examples, the first surface 136 of the wafer substrate 122 is a source-side of the semiconductor device 100. In some examples, the second surface 138 of the wafer substrate 122 is a drain-side of the semiconductor device 100.

The semiconductor device 100 includes one or more conductive pads (e.g., 112, 114, and/or 115) for the transistor 104. The semiconductor device 100 may include a conductive pad 112 associated with the transistor 104, and a conductive pad 114 associated with the transistor 104. In some examples, the transistor 104 is associated with three conductive pads. In some examples, the conductive pad 112 and the conductive pad 114 are smaller than the conductive pad 116. In some examples, the conductive pad 112 is a source contact. In some examples, the conductive pad 112 is a gate contact or a drain contact. In some examples, the conductive pad 114 is a gate contact. In some examples, the conductive pad 114 is a source contact or a drain contact. The conductive pad 112 contacts (or is coupled to) the second region 105 of the wafer substrate 122. In some examples, the conductive pad 112 contacts (or is embedded) with the first surface 136 of the wafer substrate 122. The conductive pad 114 contacts (or is coupled to) the second region 105 of the wafer substrate 122. In some examples, the conductive pad 114 contacts (or is embedded) with the first surface 136 of the wafer substrate 122.

The semiconductor device 100 includes a backplate 124 coupled to the wafer substrate 122. The backplate 124 includes a metallization material. In some examples, the backplate 124 includes a copper material. In some examples, the backplate 124 is formed on the second surface 138 of the wafer substrate 122 via a copper plating processing. In some examples, the backplate 124 is formed on the second surface 138 of the wafer substrate 122 via copper photoresist, copper plating, and copper etching process. The backplate 124 is coupled to the backside of the wafer substrate 122. The backplate 124 includes a first surface 140 and a second surface 142. The distance between the first surface 140 and the second surface 142 in the direction A3 may define the thickness of the backplate 124. The first surface 140 of the backplate 124 may be coupled to the second surface 138 of the wafer substrate 122. The backplate 124 may include a first region 144 and a second region 146. In some examples, the second region 146 is separate and disposed away from the first region 144. The first region 144 of the backplate 124 is coupled to the first region 103 of the wafer substrate 122. The second region 146 of the backplate 124 is coupled to the second region 105 of the wafer substrate 122.

The semiconductor device includes an isolation area 106 located between the first region 103 and the second region 105. In some examples, as shown in FIG. 1A, the isolation area 106 is disposed around (e.g., partially around or fully around) the second region 105 of the wafer substrate 122. In some examples, the isolation area 106 includes a portion 107 that extends in the direction A1, a portion 111 that extends in the direction A2, and a portion 113 that extends in the direction A2. In some examples, the isolation area 106 includes a portion 109 that extends in the direction A1. In some examples, the portion 107 and the portion 109 are opposite sides of the isolation area 106. In some examples, the portion 111 and the portion 113 are opposite sides of the isolation area 106. In some examples, the portion 109 extends along an outer edge 180 (or is proximate to the outer edge 180) of the semiconductor device 100 in the direction A1. The portion 111 connects to the portion 109, and the portion 111 extends from the outer edge 180 towards a central area 182 of the semiconductor device 100 in the direction A2. The portion 107 connects to the portion 111 and extends in the direction A1. The portion 113 is connected to the portion 107 and extends in the direction A2 towards the outer edge 180.

The isolation area 106 may extend in the A3 direction as shown in FIG. 1B. In some examples, the isolation area 106 is defined (at least in part) by three portions (e.g., 107, 111, 113). In some examples, the isolation area 106 is defined (at least in part) by four portions (e.g., 107, 109, 111, 113). In some examples, the portion 107, the portion 111, the portion 113, and/or the portion 109 are linear. In some examples, the portion 107, the portion 111, the portion 113, and/or the portion 109 includes one or more bent regions.

Referring to FIG. 1B, in some examples, the isolation area 106 is a space between an edge 121 of the second region 105 and an edge 125 of the first region 103. The edge 121 and the edge 125 extends in the direction A3. In some examples, the isolation area 106 includes a cut-out portion between the first region 103 and the second region 105. For example, as further described later in the disclosure, a portion of the wafer substrate 122 may be removed to create at least a portion of the isolation area 106. In some examples, the isolation area 106 is formed by dry etch, wet etch, laser sawing, and/or mechanical blade sawing to create the isolation area 106. In some examples, the isolation area 106 extends into the space between the first region 144 of the backplate 124 and the second region 146 of the backplate 124. For example, the space between the first region 144 of the backplate 124 and the second region 146 of the backplate 124 may be defined by a distance between an edge 133 of the second region 146 and an edge 135 of the first region 144.

The semiconductor device 100 includes an encapsulation material 126. In some examples, the encapsulation material 126 is formed from a liquid encapsulation. In some examples, the encapsulation material 126 includes a molding material. In some examples, the encapsulation material 126 includes one or more types of material (e.g., in a molding compound if including multiple types of materials) such as a metal, a plastic, a resin, an epoxy, a phenolic hardener, a silica material, a pigment, a glass, a ceramic casing, and/or so forth.

The encapsulation material 126 includes a portion 141 disposed within the isolation area 106. The portion 141 of the encapsulation material 126 may provide isolation between the first region 103 and the second region 105, thereby isolating the transistor 104 from the transistor 102. In some examples, the portion 141 extends along the edge 133 and the edge 121 in the direction A3. In some examples, the portion 141 extends along the edge 135 and the edge 125 in the direction A3. In some examples, the encapsulation material 126 includes a portion 143 that contacts the second surface 142 of the backplate 124 at the first region 144 and the second surface 142 of the backplate 124 at the second region 146. In some examples, the encapsulation material 126 includes a portion 147 that contacts and extends along an edge 131 of the backplate 124 and an edge 123 of the wafer substrate 122 in the direction A3. In some examples, the encapsulation material 126 includes a portion 145 that contacts and extends along an edge 137 of the backplate 124 and an edge 127 of the wafer substrate 122 in the direction A3.

FIG. 1C illustrates an electrical diagram of the semiconductor device 100 according to an aspect. The semiconductor device 100 of FIG. 1C may integrate two transistors (e.g., transistor 102, transistor 104) into a single chip, where one of the transistors (e.g., transistor 104) is isolated from the other transistor (e.g., transistor 102). As shown in FIG. 1C, the transistor 104 is disposed in parallel with the transistor 102, where the transistor 104 is isolated from the transistor 102 via the isolation area 106 as explained with reference to FIGS. 1A and 1B. The semiconductor device 100 of FIG. 1C includes a conductive pad 116 coupled to a source of the transistor 102, and a conductive pad 117 coupled to a drain of the transistor 102. The semiconductor device 100 includes a conductive pad 112 coupled to a source of the transistor 104, and a conductive pad 115 coupled to a drain of the transistor 104. The gates of the transistor 102 and the transistor 104 are coupled to a conductive pad 114. In some examples, a separate conductive pad is provided for each of the gates of the transistor 102 and the transistor 104.

FIG. 1D illustrates an electrical diagram of the semiconductor device 100 according to another aspect. The semiconductor device 100 of FIG. 1D may integrate three transistors (e.g., transistor 102-1, transistor 102-2, transistor 104) into a single chip, where one of the transistors (e.g., transistor 104) is isolated from the other transistors (e.g., transistor 102-1, transistor 102-2). As shown in FIG. 1D, the transistor 102-1, the transistor 102-2, and the transistor 104 are disposed in parallel with each other, where the transistor 104 is isolated from the transistor 102-1 and the transistor 102-2 via the isolation area 106 as explained with reference to FIGS. 1A and 1B. The semiconductor device 100 of FIG. 1D includes a conductive pad 116-1 coupled to a source of the transistor 102-1, and a conductive pad 117-1 coupled to a drain of the transistor 102-1. The semiconductor device 100 includes a conductive pad 116-2 coupled to a source of the transistor 102-2, and a conductive pad 117-2 coupled to a drain of the transistor 102-2. The semiconductor device 100 includes a conductive pad 112 coupled to a source of the transistor 104, and a conductive pad 115 coupled to a drain of the transistor 104. The gates of the transistor 102-1, the transistor 102-2, and the transistor 104 are coupled to a conductive pad 114. In some examples, a separate conductive pad is provided for each of the gates of the transistor 102-1, the transistor 102-2, and the transistor 104.

FIG. 1E illustrates an electrical diagram of the semiconductor device 100 according to another aspect. The semiconductor device 100 of FIG. 1E may integrate four transistors (e.g., transistor 102-1, transistor 102-2, transistor 104-1, transistor 104-2) into a single chip, where a pair of transistors (e.g., transistor 104-1, transistor 104-2) is isolated from the other pair of transistors (e.g., transistor 102-1, transistor 102-2). As shown in FIG. 1E, the drains of transistor 102-1 and the transistor 102-2 are coupled together, and the drains of transistor 104-1 and the transistor 104-2 are coupled together. The pair of transistors 104-1, 104-2 are disposed in parallel with the pair of transistors 102-1, 102-2, where the pair of transistors 104-1, 104-2 are separated from the pair of transistors 102-1, 102-2 via the isolation area 106 explained with reference to FIGS. 1A and 1B. The semiconductor device 100 of FIG. 1E includes a conductive pad 116-1 coupled to a source of the transistor 102-1, and a conductive pad 116-2 coupled to a source of the transistor 102-2. The semiconductor device 100 includes a conductive pad 112-1 coupled to a source of the transistor 104-1, and a conductive pad 112-2 coupled to a source of the transistor 104-2. In some examples, the gates of the transistor 102-1 and the transistor 104-1 are coupled to a conductive pad 114-1 (e.g., the gates of the transistor 102-1 and the transistor 104-1 are coupled together). In some examples, the gates of the transistor 102-2 and the transistor 104-2 are coupled to a conductive pad 114-2 (e.g., the gates of the transistor 102-2 and the transistor 104-2 are coupled together).

Figure 2:
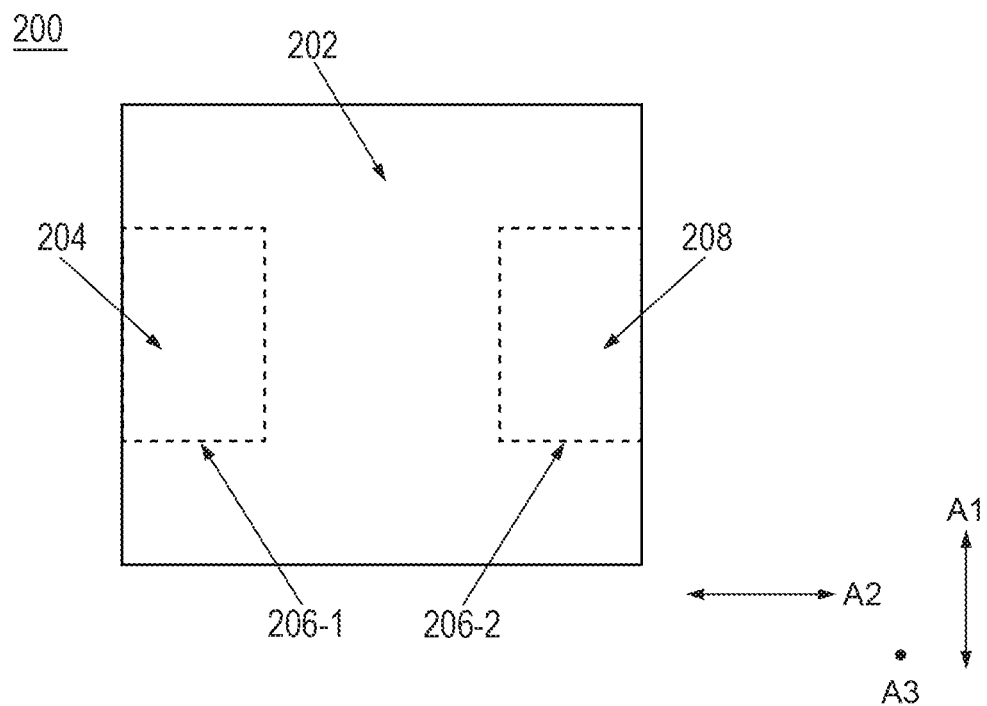
FIG. 2 illustrates a semiconductor device that integrates three devices according to an aspect.

FIG. 2 illustrates a semiconductor device 200 according to an aspect. The semiconductor device 200 may be an example of the semiconductor device 100 of FIGS. 1A through 1E and may include any of the details discussed with reference to those figures. The semiconductor device 200 may integrate three devices on a single chip. The semiconductor device 200 may include a transistor 202, a transistor 204, and a transistor 208, where the transistor 204 is isolated from the transistor 202 via a first isolation area 206-1 and the transistor 208 is isolated from the transistor 202 via a second isolation area 206-2. In some examples, the transistor 204 and the transistor 208 are integrated into the transistor 202, but the isolation that is provided by the first isolation area 206-1 and the second isolation area 206-2 isolates the transistor 204 and the transistor 208 from the transistor 202.

In some examples, the transistor 202, the transistor 204, and the transistor 208 are different FETs. In some examples, the transistor 202 is a power FET. In some examples, the transistor 204 is a sensor FET. In some examples, the transistor 204 is a power FET. In some examples, the transistor 208 is a sensor FET. In some examples, the transistor 208 is a power FET. In some examples, the transistor 202 represents multiple transistors (e.g., a pair of transistors). In some examples, the transistor 204 represents multiple transistors (e.g., a pair of transistors). In some examples, the transistor 208 represents multiple transistors (e.g., a pair of transistors). In some examples, the semiconductor device 200 is a low-voltage semiconductor chip having multiple FETs (e.g., one or more power FETs and one or more sensor FETs). In some examples, the semiconductor device 100 is a low-voltage semiconductor chip for battery protection. In some examples, the semiconductor device 200 is a 3-in-1 low-voltage semiconductor chip (e.g., three devices in one chip).

Figure 3:
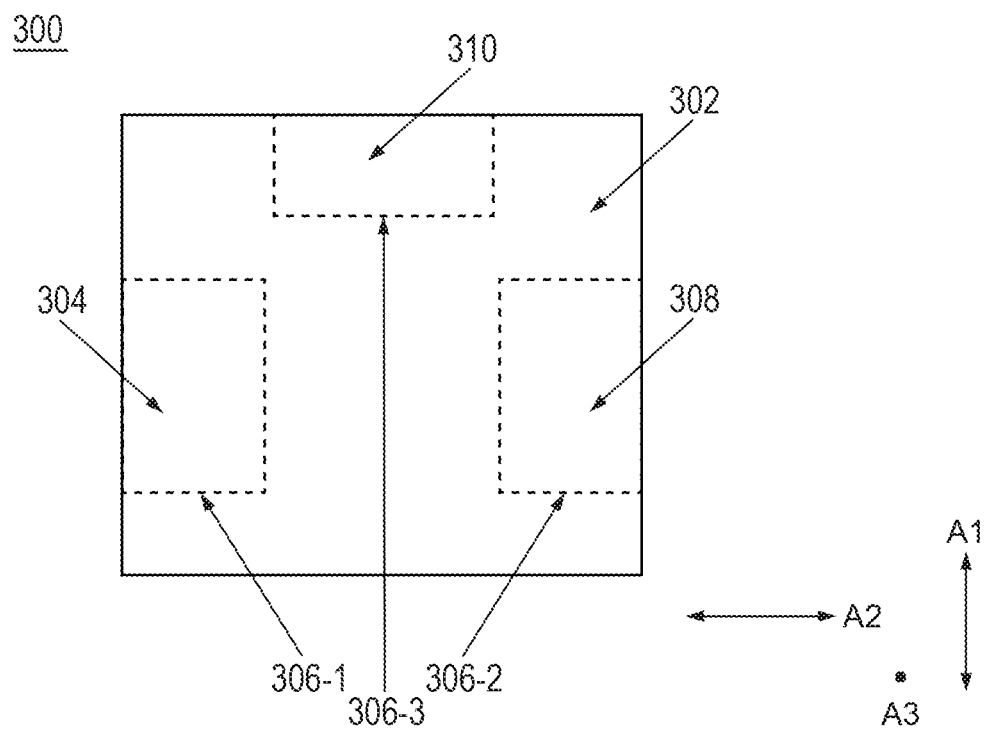
FIG. 3 illustrates a semiconductor device that integrates four devices according to an aspect.

FIG. 3 illustrates a semiconductor device 300 according to an aspect. The semiconductor device 300 may be an example of the semiconductor device 100 of FIGS. 1A through 1E and/or the semiconductor device 200 of FIG. 2 and may include any of the details discussed with reference to those figures. The semiconductor device 300 may integrate four devices on a single chip. The semiconductor device 300 may include a transistor 302, a transistor 304, a transistor 308, and a transistor 310, where the transistor 304 is isolated from the transistor 302 via a first isolation area 306-1, the transistor 308 is isolated from the transistor 302 via a second isolation area 306-2, and the transistor 310 is isolated from the transistor 302 via a third isolation area 306-3. In some examples, the transistor 304, the transistor 308, and the transistor 310 are integrated into the transistor 302, but the isolation that is provided by the first isolation area 306-1, the second isolation area 306-2, and the third isolation area 306-3 isolate the transistor 304, the transistor 308, and the transistor 310 from the transistor 302.

In some examples, the transistor 302, the transistor 304, and the transistor 308 are different FETs. In some examples, the transistor 302 is a power FET. In some examples, the transistor 304 is a sensor FET. In some examples, the transistor 304 is a power FET. In some examples, the transistor 308 is a sensor FET. In some examples, the transistor 308 is a power FET. In some examples, the transistor 310 is a sensor FET. In some examples, the transistor 310 is a power FET. In some examples, the transistor 302 is a power FET, and the transistor 304, the transistor 308, and the transistor 310 are sensor FETs. In some examples, the transistor 302 represents multiple transistors (e.g., a pair of transistors). In some examples, the transistor 304 represents multiple transistors (e.g., a pair of transistors). In some examples, the transistor 308 represents multiple transistors (e.g., a pair of transistors). In some examples, the transistor 310 represents multiple transistors (e.g., a pair of transistors). In some examples, the semiconductor device 300 is a low-voltage semiconductor chip having one or more power FETs and one or more sense FETs. In some examples, the semiconductor device 300 is a low-voltage semiconductor chip for battery protection. In some examples, the semiconductor device 300 is a 4-in-1 low-voltage semiconductor chip (e.g., four devices integrated on a single chip).

Figure 4A:
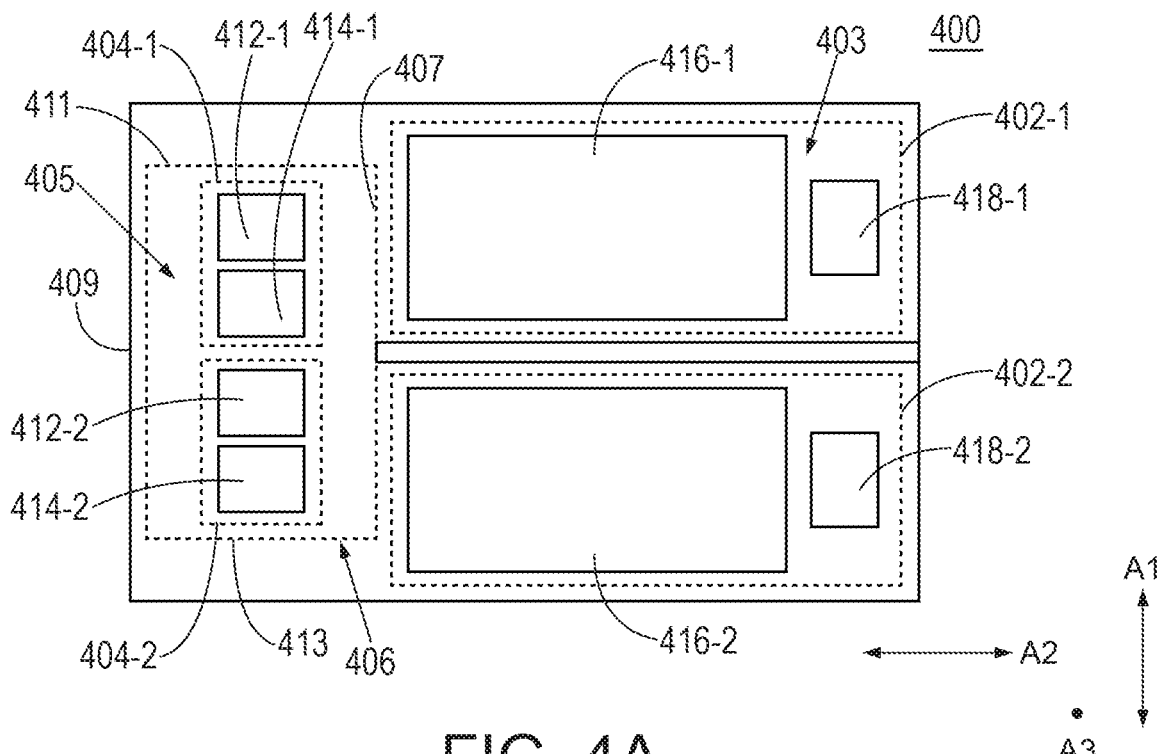
FIGS. 4A through 4B illustrate perspectives of semiconductor devices according to several aspects.
Figure 4B:
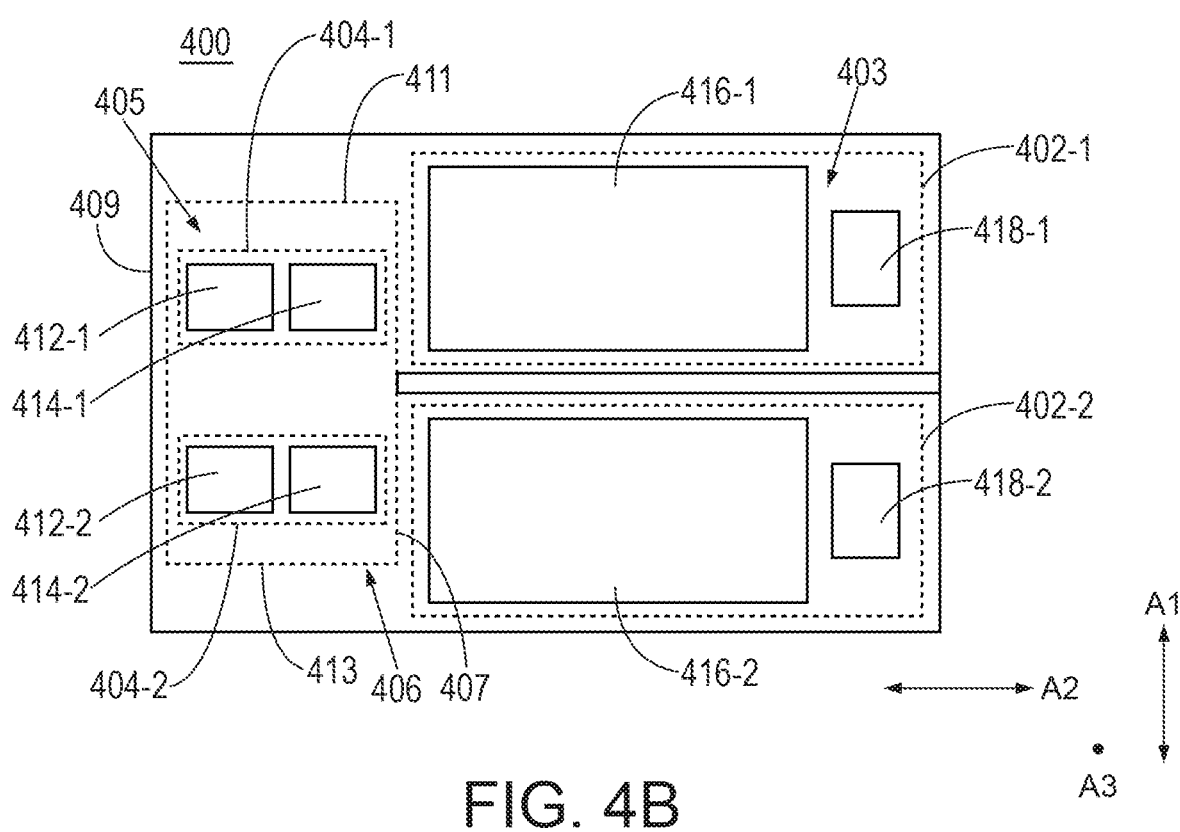

FIGS. 4A through 4B illustrate a semiconductor device 400 according to an aspect. The semiconductor device 400 includes a first sensor transistor 404-1, a second sensor transistor 404-2, a first power transistor 402-1, and a second power transistor 402-2. The semiconductor device 400 of FIGS. 4A through 4B may include any of the details of the semiconductor device 100 of FIGS. 1A through 1E, the semiconductor device 200 of FIG. 2, and/or the semiconductor device 300 of FIG. 3 and may include any of the details discussed with reference to those figures. The first sensor transistor 404-1 and the second sensor transistor 404-2 may be examples of the transistor 104 of FIGS. 1A through 1E, the transistor 204 of FIG. 2, and/or the transistor 304 of FIG. 3. The first power transistor 402-1 and the second power transistor 402-2 may be examples of the transistor 102 of FIGS. 1A through 1E, the transistor 202 of FIG. 2, and/or the transistor 302 of FIG. 3.

In some examples, the second power transistor 402-2 is the same as the first power transistor 402-1. In some examples, the second power transistor 402-2 is different from the first power transistor 402-1. In some examples, the second sensor transistor 404-2 is the same as the first sensor transistor 404-1. In some examples, the second sensor transistor 404-2 is different from the first sensor transistor 404-1. In some examples, the pair of sensor transistors (404-1, 404-2) have the same voltage source supply (VSS) rating as the pair of power transistors (402-1, 402-2). In some examples, the die size of the pair of sensor transistors (404-1, 404-2) is smaller than the die size of the pair of power transistors (402-1, 402-2). In some examples, the static source-to source on-state resistance (RSS(on)) of the pair of sensor transistors (404-1, 404-2) is higher than the RSS(on) of the pair of power transistors (402-1, 402-2).

FIGS. 4A and 4B illustrate different pad layouts for the sources and gates of the first sensor transistor 404-1, the second sensor transistor 404-2, the first power transistor 402-1, and the second power transistor 402-2. FIGS. 4A and 4B are top view perspectives of the semiconductor device 400. In the example of FIG. 4A, the source and gate conductive pads (e.g., 412-1, 414-1, 412-2, 414-2) for the first sense transistor 404-1 and the second sense transistor 404-2 are arranged according to a first pad layout. In the example of FIG. 4B, the source and gate conductive pads (e.g., 412-1, 414-1, 412-2, 414-2) for the first sensor transistor 404-1 and the second sensor transistor 404-2 are arranged according to a second pad layout. However, it is noted that the source and gate pads may be arranged according to any type of pad layout.

In some examples, the drains of the first sensor transistor 404-1 and the second sensor transistor 404-2 are connected in series with each other, and the drains of the first power transistor 402-1 and the second power transistor 402-2 are connected in series with each other. In some examples, the first and second sensor transistors 404-1, 404-2 are connected in parallel with the first and second power transistors

402-1, 402-2. The source of the first sensor transistor 404-1 may be connected to a conductive pad 412-1. The source of the second sensor transistor 404-2 may be connected to a conductive pad 412-2. The source of the first power transistor 402-1 may be connected to a conductive pad 416-1. The source of the second power transistor 402-2 may be connected to a conductive pad 416-2.

In some examples, a separate gate pad is provided for each of the first power transistor 402-1, the second power transistor 402-1, the first sensor transistor 404-1, and the second sensor transistor 404-2. For example, the gate of the first sensor transistor 404-1 may be connected to a conductive pad 414-1. The gate of the second sensor transistor 404-2 may be connected to a conductive pad 414-2. The gate of the first power transistor 402-1 may be connected to a conductive pad 418-1. The gate of the second power transistor 402-2 may be connected to a conductive pad 418-2.

In some examples, the semiconductor device 400 includes a single set of gate pad for the pairs of transistors. For example, the gate of the first power transistor 402-1 may be connected to the gate of the first sensor transistor 404-1. The gate of the first power transistor 402-1 and the gate of the first sensor transistor 404-1 may be connected to the conductive pad 414-1. The gate of the second power transistor 402-2 may be connected to the gate of the second sensor transistor 404-2. The gate of the second power transistor 402-2 and the gate of the second sensor transistor 404-2 may be connected to the conductive pad 414-2.

Figure 5:
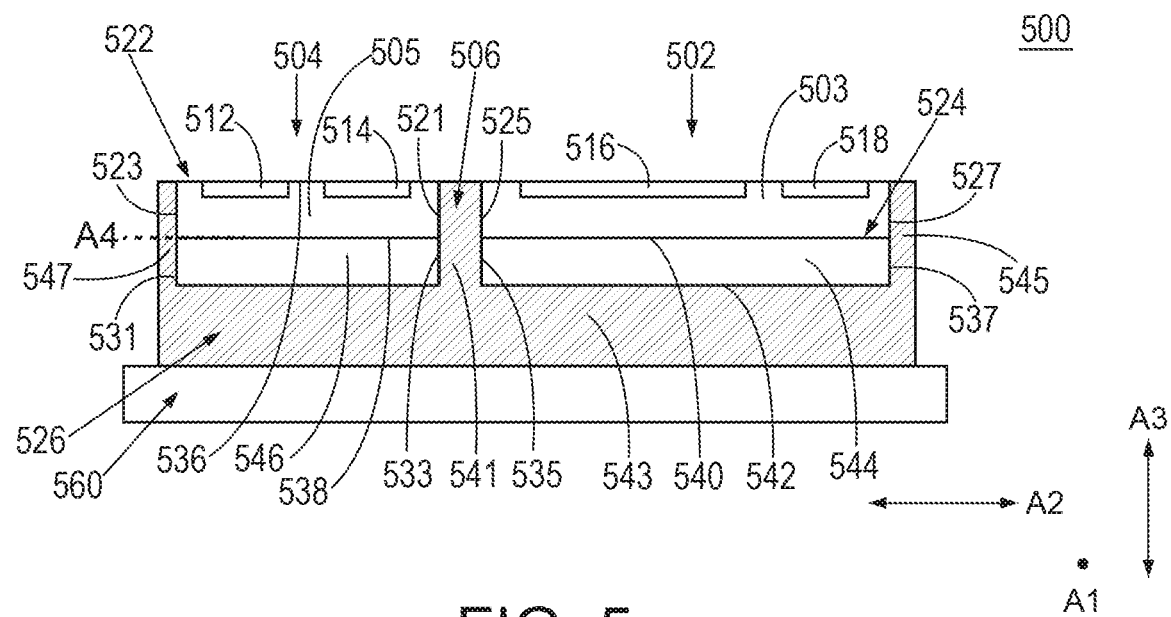
FIG. 5 illustrates a semiconductor device having an isolation area according to aspect.

The first power transistor 402-1 and the second power transistor 402-1 are defined by at least a first region 403 of a wafer substrate. The first sensor transistor 404-1 and the second sensor transistor 404-2 are defined by at least a second region 405 of the wafer substrate). The sensor transistors (404-1, 404-2) are isolated from the power transistors (402-1, 402-2) via an isolation area 406. For example, the isolation area 406 is disposed around (e.g., partially around or fully around) the second region 405. In some examples, the isolation area 406 includes a portion 407 that extends in the direction A1, a portion 411 that extends in the direction A2, and a portion 413 that extends in the direction A2. In some examples, the isolation area 106 includes a portion 409 that extends in the direction A1. In some examples, the portion 407, the portion 411, the portion 413, and/or the portion 409 are linear. In some examples, the portion 407, the portion 411, the portion 413, and/or the portion 409 includes one or more bent regions FIG. 5 illustrates a semiconductor device 500 according to an aspect. The semiconductor device 500 may be an example of the semiconductor device 100 of FIGS. 1A through 1E, the semiconductor device 200 of FIG. 2, the semiconductor device 300 of FIG. 3, and/or the semiconductor device 400 of FIGS. 4A through 4B and may include any of the details discussed with reference to those figures. In some examples, FIG. 5 is a cross-sectional view of the semiconductor device 400 of FIGS. 4A through 4B.

The semiconductor device 500 includes a wafer substrate 522. The wafer substrate 522 includes a silicon material (e.g., crystalline silicon (c-Si)). The wafer substrate 522 includes a first surface 536 and a second surface 538. In some examples, the second surface 538 is disposed in parallel with the first surface 536. The second surface 538 is disposed in a plane A4. The distance between the first surface 536 and the second surface 538 may define the thickness of the wafer substrate 522 in a direction A3.

The wafer substrate 522 includes a first region 503 and a second region 505. The first region 503 may define (or include) a transistor 502 (or at least a portion thereof). In some examples, the transistor 502 is the second power transistor 402-2 of FIGS. 4A through 4B. However, the transistor 502 may be any type of FET. The second region 505 may define (or include) a transistor 504 (or at least a portion thereof). In some examples, the transistor 504 is the second sensor transistor 404-2 of FIGS. 4A through 4B. However, the transistor 504 may be any type of FET.

The semiconductor device 500 may include a conductive pad 516 associated with the transistor 502. In some examples, the conductive pad 516 is the conductive pad 416-2 of FIGS. 4A through 4B. The semiconductor device 500 may include a conductive pad 518 associated with the transistor 502. In some examples, the conductive pad 518 is the conductive pad 418-2 of FIGS. 4A through 4B. In some examples, the conductive pad 516 is a source contact. In some examples, the conductive pad 518 is a gate contact. The conductive pad 516 contacts (or is coupled to) the first region 503 of the wafer substrate 522. In some examples, the conductive pad 516 contacts (or is embedded) with the first surface 536 of the wafer substrate 522. The conductive pad 518 contacts (or is coupled to) the first region 503 of the wafer substrate 522. In some examples, the conductive pad 518 contacts (or is embedded) with the first surface 536 of the wafer substrate 522. In some examples, the first surface 536 of the wafer substrate 522 is a source-side of the semiconductor device 500. In some examples, the second surface 538 of the wafer substrate 522 is a drain-side of the semiconductor device 500.

The semiconductor device 500 may include a conductive pad 512 associated with the transistor 504. In some examples, the conductive pad 512 is the conductive pad 412-2 of FIGS. 4A through 4B. The semiconductor device 500 includes a conductive pad 514 associated with the transistor 504. In some examples, the conductive pad 514 is the conductive pad 414-2 of FIGS. 4A through 4B. In some examples, the conductive pad 512 is a source contact. In some examples, the conductive pad 514 is a gate contact. The conductive pad 512 contacts (or is coupled to) the second region 505 of the wafer substrate 522. In some examples, the conductive pad 512 contacts (or is embedded) with the first surface 536 of the wafer substrate 522. The conductive pad 514 contacts (or is coupled to) the second region 505 of the wafer substrate 522. In some examples, the conductive pad 514 contacts (or is embedded) with the first surface 536 of the wafer substrate 522.

The semiconductor device 500 includes a backplate 524 coupled to the wafer substrate 522. The backplate 524 includes a metallization material. In some examples, the backplate 524 includes a copper material. In some examples, the backplate 524 is formed on the second surface 538 of the wafer substrate 522 via a copper plating process. In some examples, the backplate 524 is formed on the second surface 538 of the wafer substrate 522 via a copper photoresist, copper plating, and copper etching process. The backplate 524 is coupled to the backside of the wafer substrate 522. The backplate 524 includes a first surface 540 and a second surface 542. The distance between the first surface 540 and the second surface 542 in the direction A3 may define the thickness of the backplate 524. The first surface 540 of the backplate 524 may be coupled to the second surface 538 of the wafer substrate 522. The backplate 524 may include a first region 544 and a second region 546. In some examples, the second region 546 is separate and disposed away from the first region 544. The first region 544 of the backplate 524 is coupled to the first region 503 of the wafer substrate 522. The second region 546 of the backplate 524 is coupled to the second region 505 of the wafer substrate 522. In some examples, the semiconductor device 500 includes a tape 560 coupled to the encapsulation material 526.

The semiconductor device includes an isolation area 506 located between the first region 503 and the second region 505. The isolation area 506 is a space between an edge 521 of the second region 505 and an edge 525 of the first region 503. The edge 521 and the edge 525 extends in the direction A3. In some examples, the isolation area 506 includes a cut-out portion between the first region 503 and the second region 505. For example, a portion of the wafer substrate 522 may be removed to create at least a portion of the isolation area 506. In some examples, the isolation area 506 is formed by dry etch, wet etch, laser sawing, and/or mechanical blade sawing to create the isolation area 506. In some examples, the isolation area 506 extends into the space between the first region 544 of the backplate 524 and the second region 546 of the backplate 524. The space between the first region 544 of the backplate 524 and the second region 546 of the backplate 524 may be defined by a distance between an edge 533 of the second region 546 and an edge 535 of the first region 544.

The semiconductor device 500 includes an encapsulation material 526. In some examples, the encapsulation material 526 is formed from a liquid encapsulation. In some examples, the encapsulation material 526 includes a molding material. In some examples, the encapsulation material 526 includes one or more types of material (e.g., in a molding compound if including multiple types of materials) such as a metal, a plastic, a resin, an epoxy, a phenolic hardener, a silica material, a pigment, a glass, a ceramic casing, and/or so forth.

The encapsulation material 526 includes a portion 541 disposed within the isolation area 506. The portion 541 of the encapsulation material 526 may provide isolation between the first region 503 and the second region 505, thereby isolating the transistor 504 from the transistor 502. In some examples, the portion 541 extends along the edge 533 and the edge 521 in the direction A3. In some examples, the portion 541 extends along the edge 535 and the edge 525 in the direction A3. In some examples, the encapsulation material 526 includes a portion 543 that contacts the second surface 542 of the backplate 524 at the first region 544 and the second surface 542 of the backplate 524 at the second region 546. In some examples, the encapsulation material 526 includes a portion 547 that contacts and extends along an edge 531 of the backplate 524 and an edge 523 of the wafer substrate 522 in the direction A3. In some examples, the encapsulation material 526 includes a portion 545 that contacts and extends along an edge 537 of the backplate 524 and an edge 527 of the wafer substrate 522 in the direction A3.

Figure 6:
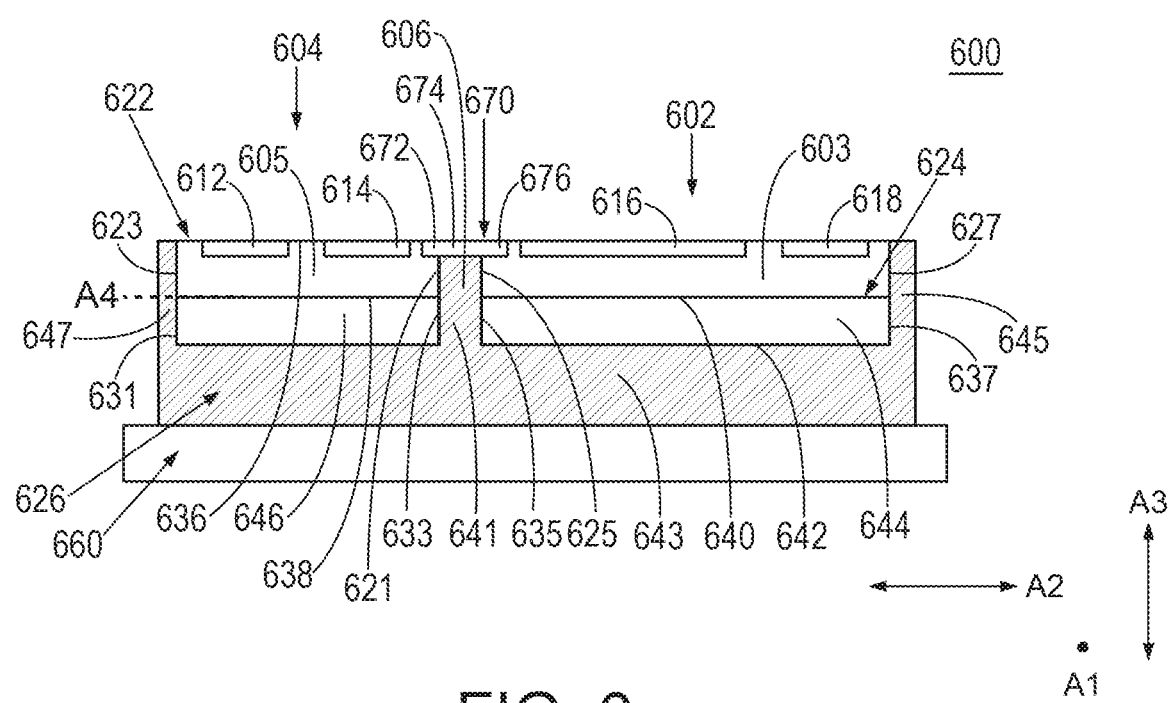
FIG. 6 illustrates a semiconductor device having a dielectric layer according to an aspect.

FIG. 6 illustrates a semiconductor device 600 according to an aspect. The semiconductor device 600 may be an example of the semiconductor device 100 of FIGS. 1A through 1E, the semiconductor device 200 of FIG. 2, the semiconductor device 300 of FIG. 3, the semiconductor device 400 of FIGS. 4A through 4B, and the semiconductor device 500 of FIG. 5 and may include any of the details discussed with reference to those figures. In some examples, FIG. 6 is a cross-sectional view of the semiconductor device 400 of FIGS. 4A through 4B. In some examples the semiconductor device 600 is the same as the semiconductor device 500 of FIG. 5 except that the semiconductor device 600 includes a dielectric layer 670. The dielectric layer 670 is coupled to a wafer substrate 622 at a location between a first region 603 of the wafer substrate 622 and a second region 605 of the wafer substrate 622. In some examples, an encapsulation material 626 has a portion 641 that contacts the dielectric layer 670 within the isolation area 606. The dielectric layer 670 may further assist in providing isolation between the transistor 604 and the transistor 602.

The wafer substrate 622 includes a silicon material (e.g., crystalline silicon (c-Si)). The wafer substrate 622 includes a first surface 636 and a second surface 638. In some examples, the second surface 638 is disposed in parallel with the first surface 636. The second surface 638 is disposed in a plane A4. The wafer substrate 622 includes a first region 603 and a second region 605. The first region 603 may define (or include) a transistor 602 (or at least a portion thereof). In some examples, the transistor 602 is the second power transistor 402-2 of FIGS. 4A through 4B. In some examples, the transistor 602 is the transistor 502 of FIG. 5. However, the transistor 602 may be any type of FET. The second region 605 may define (or include) a transistor 604 (or at least a portion thereof). In some examples, the transistor 604 is the second sensor transistor 404-2 of FIGS. 4A through 4B. In some examples, the transistor 604 is the transistor 504 of FIG. 5. However, the transistor 604 may be any type of FET.

The semiconductor device 600 may include a conductive pad 616 associated with the transistor 602. In some examples, the conductive pad 616 is the conductive pad 416-2 of FIGS. 4A through 4B. The semiconductor device 600 may include a conductive pad 618 associated with the transistor 602. In some examples, the conductive pad 618 is the conductive pad 418-2 of FIGS. 4A through 4B. In some examples, the conductive pad 616 is a source contact. In some examples, the conductive pad 618 is a gate contact.

The semiconductor device 600 may include a conductive pad 612 associated with the transistor 604. In some examples, the conductive pad 612 is the conductive pad 412-2 of FIGS. 4A through 4B. The semiconductor device 600 includes a conductive pad 614 associated with the transistor 604. In some examples, the conductive pad 614 is the conductive pad 414-2 of FIGS. 4A through 4B. In some examples, the conductive pad 612 is a source contact. In some examples, the conductive pad 614 is a gate contact.

The semiconductor device 600 includes a backplate 624 coupled to the wafer substrate 622. The backplate 624 includes a first surface 640 and a second surface 642. The backplate 624 may include a first region 644 and a second region 646. In some examples, the second region 646 is separate and disposed away from the first region 644. The first region 644 of the backplate 624 is coupled to the first region 603 of the wafer substrate 622. The second region 646 of the backplate 624 is coupled to the second region 605 of the wafer substrate 622. In some examples, the semiconductor device 600 includes a tape 660 coupled to the encapsulation material 626.

The semiconductor device includes an isolation area 606 located between the first region 603 and the second region 605. The isolation area 606 is a space between an edge 621 of the second region 605 and an edge 625 of the first region 603. The edge 621 and the edge 625 extends in the direction A3. In some examples, the isolation area 606 includes a cut-out portion between the first region 603 and the second region 605. For example, a portion of the wafer substrate 622 may be removed to create at least a portion of the isolation area 606. In some examples, the isolation area 606 is formed by dry etch, wet etch, laser sawing, and/or mechanical blade sawing to create the isolation area 606. In some examples, the isolation area 606 extends into the space between the first region 644 of the backplate 624 and the second region 646 of the backplate 624. The space between the first region 644 of the backplate 624 and the second region 646 of the backplate 624 may be defined by a distance between an edge 633 of the second region 646 and an edge 635 of the first region 644.

The semiconductor device 600 includes an encapsulation material 626. The encapsulation material 626 includes a portion 641 disposed within the isolation area 606. The portion 641 of the encapsulation material 626 may provide isolation between the first region 603 and the second region 605, thereby isolating the transistor 604 from the transistor 602. In some examples, the portion 641 extends along the edge 633 and the edge 621 in the direction A3. In some examples, the portion 641 extends along the edge 635 and the edge 625 in the direction A3. In some examples, the encapsulation material 626 includes a portion 643 that contacts the second surface 642 of the backplate 624 at the first region 644 and the second surface 642 of the backplate 624 at the second region 646. In some examples, the encapsulation material 626 includes a portion 647 that contacts and extends along an edge 631 of the backplate 624 and an edge 623 of the wafer substrate 622 in the direction A3. In some examples, the encapsulation material 626 includes a portion 645 that contacts and extends along an edge 637 of the backplate 624 and an edge 627 of the wafer substrate 622 in the direction A3.

The dielectric layer 670 may be a thin piece (e.g., continuous piece) that extends across the isolation area 606. The dielectric layer 670 may include any type of dielectric material or insulating material. In some examples, the dielectric layer 670 includes a polymer-based material. In some examples, the dielectric layer 670 may include oxide, nitride, polyimide (PI), and/or polybenzoxazole (PBO) materials. The dielectric layer 670 may include a portion 672 that contacts the second region 605. In some examples, the portion 672 contacts the first surface 636 at the second region 605. The dielectric layer 670 may include a portion 674 that is disposed between the edge 621 and the edge 625. The portion 641 of the encapsulation material 626 may contact the portion 674 of the dielectric layer 670. The dielectric layer 670 may include a portion 676 that contacts the first region 603. In some examples, the portion 676 contacts the first surface 636 at the first region 603.

FIGS. 7A through 7D depict example fabrication operations for manufacturing a wafer substrate assembly according to an aspect. The wafer substrate assembly includes a carrier member 763, a wafer substrate 722 coupled to the carrier member 763, and a backplate 724 coupled to the wafer substrate 722. The wafer substrate 722 and the backplate 724 may be examples of any of the wafer substrates and backplates discussed with reference to the previous figures. In some examples, the wafer substrate assembly includes one or more conductive pads coupled to the wafer substrate 722. The fabrication operations may be applicable to any of the semiconductor devices discussed herein such as the semiconductor device 100 of FIGS. 1A through 1E, the semiconductor device 200 of FIG. 2, the semiconductor device 300 of FIG. 3, the semiconductor device 400 of FIGS. 4A through 4B, the semiconductor device 500 of FIG. 5, and/or the semiconductor device 600 of FIG. 6. Although the flowchart of FIGS. 7A through 7D illustrate operations in sequential order, it will be appreciated that this is merely an example, and that additional or alternative operations may be included. Further, operations of FIGS. 7A through 7D and related operations may be executed in a different order than that shown, or in a parallel or overlapping fashion.

Figure 7A:
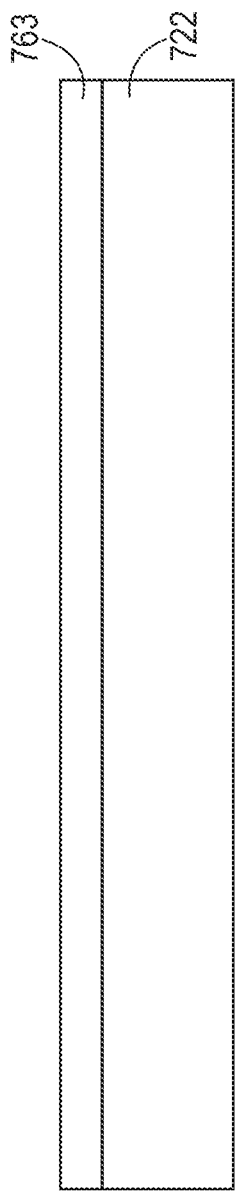
FIGS. 7A through 7D illustrate operations for creating a wafer substrate assembly according to an aspect.
Figure 7B:
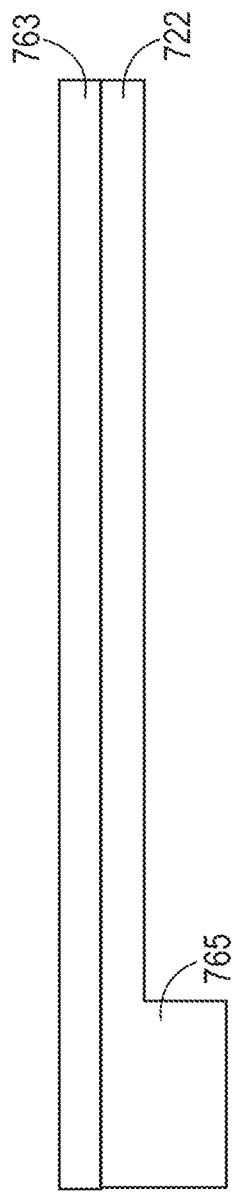
Figure 7C:
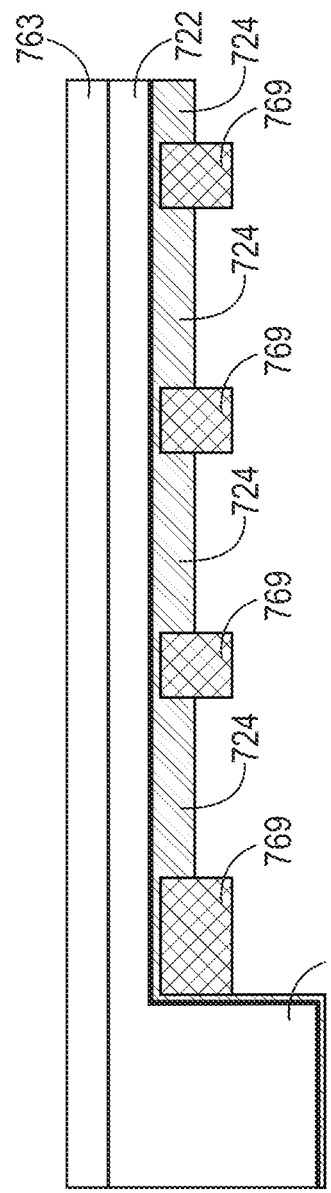
Figure 7D:
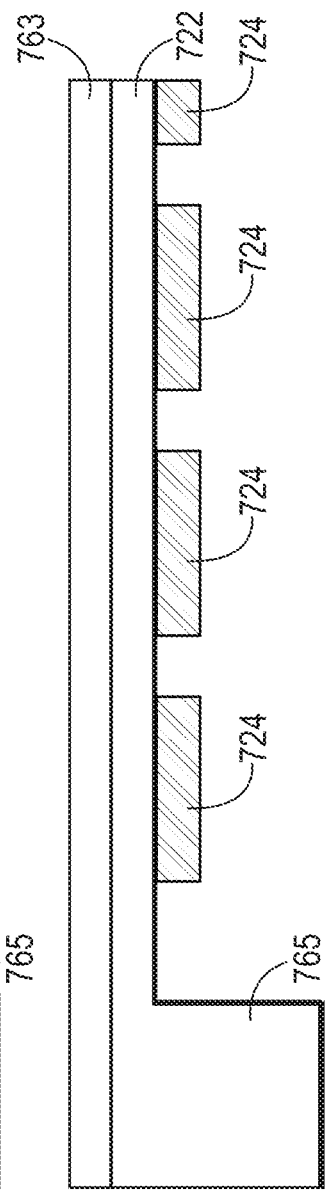

As shown in FIG. 7A, operation 702 includes coupling a carrier member 763 to a wafer substrate 722. In some examples, the carrier member 763 includes tape (e.g., acid resistance tape). As shown in FIG. 7B, operation 704 includes a silicon etching process to remove a portion of the silicon material from the wafer substrate 722. In some examples, the wafer substrate 722 includes an enlarged portion 765, which may be referred to as a ring or ring member. As shown in FIG. 7C, operation 706 includes de-tap and tape mount operation (e.g., replacing the carrier member 763 with another type of carrier member 763 such as a heat resistance tap) and copper photo and copper plating operations to form the backplate 724 and the copper photoresist portions 769. As shown in FIG. 7D, operation 708 includes removing the photoresist portions 769 and copper etching to remove portions of the backplate 724.

FIGS. 8A through 8E depict example fabrication operations for manufacturing a semiconductor device having isolated transistors(s). The fabrication operations may be applicable to any of the semiconductor devices discussed herein such as the semiconductor device 100 of FIGS. 1A through 1E, the semiconductor device 200 of FIG. 2, the semiconductor device 300 of FIG. 3, the semiconductor device 400 of FIGS. 4A through 4B, the semiconductor device 500 of FIG. 5, and/or the semiconductor device 600 of FIG. 6. Although the flowchart of FIGS. 8A through 8E illustrate operations in sequential order, it will be appreciated that this is merely an example, and that additional or alternative operations may be included. Further, operations of FIGS. 8A through 8E and related operations may be executed in a different order than that shown, or in a parallel or overlapping fashion.

As shown in FIG. 8A, operation 802 includes providing a wafer substrate assembly having a carrier member 863, a wafer substrate 822 coupled to the carrier member 863, and a backplate 824 coupled to the wafer substrate 822. In some examples, the wafer substrate assembly includes conductive pads coupled to the wafer substrate 822 such as conductive pad 812, conductive pad 814, conductive pad 816, and conductive pad 818. The wafer substrate assembly includes a backplate portion 844 coupled to a first region 803 of the wafer substrate 822, and a backplate portion 846 coupled to a second region 805 of the wafer substrate 822. In some examples, the wafer substrate assembly is the wafer substrate assembly produced by the operations discussed with reference to FIGS. 7A through 7D.

As shown in FIG. 8B, operation 804 includes removing a portion 893 (shown in FIG. 8A) of the wafer substrate 822 located between the backplate portion 844 and the backplate portion 846 to create an isolation area 807. In some examples, the portion 893 is removed by dry etching, wet etching, laser sawing, and/or mechanical blade sawing. As shown in FIG. 8C, operation 806 includes applying an encapsulation material 826 to the wafer substrate assembly, including depositing a portion 841 of the encapsulation material 826 within the isolation area 807. As shown in FIG. 8D, operation 808 includes marking/singulation. As shown in FIG. 8E, operation 810 includes removing the carrier member 863 and mounting a tape 860 on the encapsulation material 826.

FIGS. 9A through 9E depict example fabrication operations for manufacturing a semiconductor device having isolated transistors(s). The fabrication operations may be applicable to any of the semiconductor devices discussed herein such as the semiconductor device 100 of FIGS. 1A through 1E, the semiconductor device 200 of FIG. 2, the semiconductor device 300 of FIG. 3, the semiconductor device 400 of FIGS. 4A through 4B, the semiconductor device 500 of FIG. 5, and/or the semiconductor device 600 of FIG. 6. Although the flowchart of FIGS. 9A through 9E illustrate operations in sequential order, it will be appreciated that this is merely an example, and that additional or alternative operations may be included. Further, operations of FIGS. 9A through 9E and related operations may be executed in a different order than that shown, or in a parallel or overlapping fashion.

As shown in FIG. 9A, operation 902 includes providing a wafer substrate assembly having a carrier member 963, a wafer substrate 922 coupled to the carrier member 963, and a backplate 924 coupled to the wafer substrate 922. In some examples, the wafer substrate assembly includes conductive pads coupled to the wafer substrate 922 such as conductive pad 912, conductive pad 914, conductive pad 916, and conductive pad 918. The wafer substrate assembly includes a backplate portion 944 coupled to a first region 903 of the wafer substrate 922, and a backplate portion 946 coupled to a second region 905 of the wafer substrate 922. In some examples, the wafer substrate assembly is the wafer substrate assembly produced by the operations discussed with reference to FIGS. 7A through 7D. Also, the wafer substrate assembly includes a dielectric layer 970 coupled to the wafer substrate 922.

As shown in FIG. 9B, operation 904 includes removing a portion 993 (shown in FIG. 9A) of the wafer substrate 922 located between the backplate portion 944 and the backplate portion 946 to create an isolation area 907. The dielectric layer 970 is exposed through the backside. In some examples, the portion 993 is removed by dry etching, wet etching, laser sawing, and/or mechanical blade sawing. As shown in FIG. 9C, operation 906 includes applying an encapsulation material 926 to the wafer substrate assembly, including depositing a portion 941 of the encapsulation material 926 within the isolation area 907. The portion 941 contacts the dielectric layer 970. As shown in FIG. 9D, operation 908 includes marking/singulation. As shown in FIG. 9E, operation 910 includes removing the carrier member 963 and mounting a tape 960 on the encapsulation material 926.

FIG. 10 depicts a flowchart 1000 depicting example fabrication operations for manufacturing a wafer substrate assembly according to an aspect. Although the flowchart 1000 is described with reference to the semiconductor device of FIGS. 8A through 8E, the flowchart may be applicable to any of the semiconductor devices discussed herein. Although the flowchart 1000 of FIG. 10 illustrates operations in sequential order, it will be appreciated that this is merely an example, and that additional or alternative operations may be included. Further, operations of FIG. 10 and related operations may be executed in a different order than that shown, or in a parallel or overlapping fashion.

Operation 1002 includes providing a wafer substrate assembly, where the wafer substrate assembly includes a carrier member 863, a wafer substrate 822 coupled to the carrier member 863, a backplate portion 844 coupled to a first region 803 of the wafer substrate 822, and a backplate portion 846 coupled to a second region 805 of the wafer substrate 822. Operation 1004 includes removing a portion 893 of the wafer substrate 822 located between the backplate portion 844 and the backplate portion 846 to create an isolation area 807. Operation 1006 includes applying an encapsulation material 826 to the wafer substrate assembly, including depositing a portion 841 of the encapsulation material 826 within the isolation area 807.

It will be understood that, in the foregoing description, when an element is referred to as being connected to, electrically connected to, coupled to, or electrically coupled to another element, it may be directly connected or coupled to the other element, or one or more intervening elements may be present. In contrast, when an element is referred to as being directly connected to or directly coupled to another element, there are no intervening elements. Although the terms directly connected to, or directly coupled to may not be used throughout the detailed description, elements that are shown as being directly connected or directly coupled can be referred to as such. The claims of the application, if any, may be amended to recite exemplary relationships described in the specification or shown in the figures. Implementations of the various techniques described herein may be implemented in (e.g., included in) digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application specific integrated circuit).

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or subcombinations of the functions, components and/or features of the different embodiments described.

What is claimed is:

1. A semiconductor device for integrating multiple transistors, the semiconductor device comprising:
   a wafer substrate including a first region and a second region, the first region defining at least a portion of at least one first transistor, the second region defining at least a portion of at least one second transistor;
   an isolation area located between the first region and the second region;
   at least one conductive pad of the at least one first transistor contacting the first region of the wafer substrate;
   at least one conductive pad of the at least one second transistor contacting the second region of the wafer substrate;
   a backplate coupled to the wafer substrate; and
   an encapsulation material, the encapsulation material having a portion contacting the backplate, the encapsulation material including a portion located within the isolation area.

2. The semiconductor device of claim 1, wherein the isolation area is a first isolation area, and the wafer substrate includes a third region, the third region defining at least a portion of at least one third transistor, the semiconductor device further comprising:
  a second isolation area located between the first region and the third region,
  wherein the encapsulation material includes a portion located within the second isolation area.

3. The semiconductor device of claim 1, further comprising:
  a dielectric layer having a portion that contacts the portion of the encapsulation material located within the isolation area.

4. The semiconductor device of claim 1, wherein the backplate includes a first region and a second region, the first region of the backplate contacting the first region of the wafer substrate, the second region of the backplate contacting the second region of the wafer substrate,
  wherein the isolation area extends between the first region of the backplate and the second region of the backplate.

5. The semiconductor device of claim 4, wherein the encapsulation material includes a portion that contacts the first region of the backplate and a portion that contacts the second region of the backplate.

6. The semiconductor device of claim 1, wherein the first region defines a first edge and a second edge, and the second region defines a first edge and a second edge, wherein the portion of the encapsulation material located within the isolation area contacts the second edge of the first region and the second edge of the second region.

7. The semiconductor device of claim 6, wherein the encapsulation material includes a portion that contacts the first edge of the first region, and a portion that contacts the first edge of the second region.

8. The semiconductor device of claim 1, wherein the at least one first transistor is a power field-effect transistor (FET).

9. The semiconductor device of claim 1, wherein the at least one second transistor is a sensor field effect transistor (FET).

10. A semiconductor device for integrating multiple transistors, the semiconductor device comprising:
  a wafer substrate including a first region and a second region, the first region defining at least a portion of at least one first transistor, the second region defining at least a portion of at least one second transistor;
  a backplate including a first region and a second region, the first region of the backplate contacting the first region of the wafer substrate, the second region of the backplate contacting the second region of the wafer substrate;
  an isolation area located between the first region of the wafer substrate and the second region of the wafer substrate, the isolation area extending between the first region of the backplate and the second region of the backplate; and
  an encapsulation material, the encapsulation material including a portion that contacts the first region of the backplate, a portion that contacts the second region of the backplate, and a portion located within the isolation area.

11. The semiconductor device of claim 10, further comprising:
  at least one conductive pad of the first transistor contacting the first region of the wafer substrate;
  at least one conductive pad of the second transistor contacting the second region of the wafer substrate.

12. The semiconductor device of claim 11, wherein the at least one conductive pad of the at least one first transistor includes a source terminal and a gate terminal of the at least one transistor, the at least one conductive pad of the at least one second transistor includes a source terminal and a gate terminal of the at least one second terminal.

13. The semiconductor device of claim 10, wherein the at least one first transistor includes two first transistors, and the at least one second transistor includes two second transistors, wherein drains of the two first transistors are connected in series, wherein drains of the two second transistors are connected in series.

14. The semiconductor device of claim 10, further comprising:
  a dielectric material layer having a first portion, a second portion, and a third portion, the first portion contacting the first region of the wafer substrate, the second portion contacting the portion of the encapsulation material located within the isolation area, the third portion contacting the second region of the wafer substrate.

15. The semiconductor device of claim 10, wherein the encapsulation material includes a molding material.

16. The semiconductor device of claim 10, wherein the first region of the wafer substrate defines a first edge and a second edge, and the second region of the wafer substrate defines a first edge and a second edge, wherein the portion of the encapsulation material located within the isolation area contacts the second edge of the first region and the second edge of the second region.

17. The semiconductor device of claim 16, wherein the encapsulation material includes a portion that contacts the first edge of the first region, and a portion that contacts the first edge of the second region.

18. The semiconductor device of claim 10, wherein the at least one first transistor is a power field-effect transistor (FET), and the at least one second transistor is a sensor FET.

19. A method for integrating multiple transistors in a semiconductor device, the method comprising:
  providing a wafer substrate assembly, the wafer substrate assembly including a carrier member, a wafer substrate coupled to the carrier member, a first backplate portion coupled to a first region of the wafer substrate, and a second backplate portion coupled to a second region of the wafer substrate;
  removing a portion of the wafer substrate located between the first backplate portion and the second backplate portion to create an isolation area; and
  applying an encapsulation material to the wafer substrate assembly, including depositing a portion on the first and second backplate portions and depositing a portion of the encapsulation material within the isolation area.

20. The method of claim 19, wherein the wafer substrate assembly includes a dielectric material layer that contacts the wafer substrate at a location between the first region and the second region, the portion of the encapsulation material contacting the dielectric material layer.

* * * * *